(12) United States Patent
Pregartner

(10) Patent No.: US 8,977,511 B2
(45) Date of Patent: Mar. 10, 2015

(54) METHOD FOR CLASSIFYING ELECTRICAL SHEET

(75) Inventor: Helmut Pregartner, Krottendorf (AT)

(73) Assignee: Siemens Aktiengesellschaft Österreich, Vienna (AT)

( * ) Notice: Subject to any disclaimer, the term of this patent is extended or adjusted under 35 U.S.C. 154(b) by 483 days.

(21) Appl. No.: 13/387,404

(22) PCT Filed: Jul. 29, 2009

(86) PCT No.: PCT/EP2009/059777
§ 371 (c)(1),
(2), (4) Date: Jan. 27, 2012

(87) PCT Pub. No.: WO2011/012159
PCT Pub. Date: Feb. 3, 2011

(65) Prior Publication Data
US 2012/0130664 A1  May 24, 2012

(51) Int. Cl.
*G01R 25/00* (2006.01)
*G01N 27/72* (2006.01)
*G01R 33/04* (2006.01)
*B06B 1/08* (2006.01)

(52) U.S. Cl.
CPC .. *G01R 33/04* (2013.01); *B06B 1/08* (2013.01)
USPC ............................................. 702/65; 324/228

(58) Field of Classification Search
USPC ............... 702/65, 57, 64, 75, 77, 81, 84, 127, 702/141–142, 182, 189; 324/200, 207.21, 324/209, 228, 260, 263; 335/281–282, 297, 335/299
See application file for complete search history.

(56) References Cited

U.S. PATENT DOCUMENTS

| 5,456,113 A | 10/1995 | Kwun |
| 2001/0025410 A1 | 10/2001 | Daniels |
| 2007/0046289 A1 | 3/2007 | Troxler |

FOREIGN PATENT DOCUMENTS

| CN | 1741866 A | 3/2006 |
| CN | 101221221 A | 7/2008 |
| CN | 101354380 A | 1/2009 |

OTHER PUBLICATIONS

Namikawa et al., High Silicon Steel Sheets Realizing Excellent High Frequency Reactor Performance, Oct. 2005, JFE Technical Report, No. 6, pp. 12-17.*
Phway et al., Frequency Dependence of Magnetostriction for Magnetic Actuators, 2004, Journal of Electrical Engineering, vol. 55, No. 10/S, pp. 7-10.*
Koenig et al., Rapid Magnetic Flux Change in Amorphous Strip-Wound Cores, 1997 IEEE, pp. 999-1004.*
Kenny et al., Comparison of the Dynamic Response of Radial and Tangential Magnetic Flux Thrust Bearings, Mar. 2002, IEEE/ASME Transactions on Mechatronics, vol. 7, No. 1, pp. 61-66.*
Moses et al., AC Barkhausen Noise in Electrical Steels: Influence of Sensing Technique on Interpretation of Measurements, 2006, Journal of Electrical Engineering, vol. 57, No. 8/S, pp. 3-8.*

* cited by examiner

*Primary Examiner* — Toan Le

(57) ABSTRACT

A method for classifying electrical sheet is produced. The electrical sheet is used to produce an electrical machine and is available in the form of a strip roll wherein a magnetic flux that changes over time and that causes a shape change of the strip roll and magnetic losses is produced in the strip roll using an excitation winding fed by a feeding device, the shape change and/or the magnetic losses are measured using a measuring device and the measurement signal obtained is fed to an evaluation device, and the evaluation device categorizes the electrical sheet in regard to noise emission and/or magnetic losses using the measurement signal.

19 Claims, 3 Drawing Sheets

METHOD FOR CLASSIFYING ELECTRICAL SHEET

CROSS REFERENCE TO RELATED APPLICATIONS

This application is the US National Stage of International Application No. PCT/EP2009/059777, filed Jul. 29, 2009 and claims the benefit thereof. All of the applications are incorporated by reference herein in their entirety.

TECHNICAL FIELD

The invention relates to a method for classifying electric sheet steel, which is used for producing an electrical machine and is in the form of a strip-wound coil.

PRIOR ART

The noise emission that occurs during operation of an electrical unit, e.g. a power transformer, is perceived to be disruptive particularly if the unit is installed in the vicinity of a living area. When producing a low-noise power transformer the aim is therefore to use a magnetically soft material which has optimally low magnetostriction. In practice, however, classifying magnetically soft materials proves to be difficult. For the purpose of classifying, a sample is conventionally taken from a strip-wound coil (from which the sheet metal parts for the transformer core are punched in a subsequent processing step) and is analyzed in a measuring device with regard to magnetostriction behavior and other magnetic properties. In this case firstly the problem occurs that known measuring devices do not provide consistent measuring results. Secondly, the measuring result is dependent on the site of sampling: it may be that a sample taken at the start of a strip-wound coil and a sample taken at the end of the strip-wound coil each exhibit very different magnetostriction behavior. A satisfactory prediction of the noise behavior of the electrical machine is virtually impossible with known measuring and classifying methods.

EMBODIMENTS OF THE INVENTION

It is an object of the present invention to disclose a method for classifying electric sheet steel with which the noise behavior and optionally also prediction of the magnetic losses of an electrical machine may be improved.

This object is achieved by a method with the features of the claims. Advantageous embodiments are defined in the dependent claims.

For classifying the magnetically soft starting product, in a basic idea the invention does not start from investigating a sample taken from the material supplied but the strip-wound coil as a whole, as is supplied to the production plant. For this purpose the sheet coil, also called a coil, is provided with an excitation winding. A magnetic flux that changes over time is produced in the wound flat strip by means of a feeding device. This magnetic flux that changes over time results in a change in the shape of the strip-wound coil owing to magnetostriction. Vibrations occur in the preferred direction of the magnetic material in accordance with magnetostriction. The changes in the shape of the strip-wound coil that run transversely to the preferred direction are measured by means of a measuring device, as are optionally the magnetic losses, and are supplied to an evaluation device. Noise levels (sound power levels) and loss ratios are calculated in the evaluation device and these values are assigned to categories. The anticipated operating behavior of the electrical machine, i.e. with regard to the anticipated noise behavior and optionally also with regard to the anticipated magnetic losses, can be better predicted in this way. As a result of the inventive method those strip-wound coils which seem to be particularly suitable or less suitable for low-noise operation of an electrical machine can be filtered out from those supplied before production starts. Since the coil is evaluated in its entirety the result of classifying is no longer dependent on the site of sampling. Prognosis is much more accurate with the inventive method. The inventive method is particularly significant financially when producing large machines, such as low-noise power transformers. The evaluation device, which classifies or categorizes the electric sheet steel, can automatically make the classification on the basis of predefined features (noise level, losses). The evaluation unit is e.g. an appropriately modified personal computer (PC) which can be assembled comparatively easily from hardware and software components that are known per se. In production the allocation of the electric sheet steel to noise categories requires only little expenditure. The classification method is largely unsusceptible to interference.

The change in shape of the strip-wound coil may be detected particularly easily metrologically in the axial direction of the sheet coil by arranging a sensor device on one or optionally both end face(s) of the strip-wound coil which detect the vibrations in the axial direction of the strip-wound coil.

If a plurality of detectors is arranged on each end face the change in length can easily be averaged.

Conventionally available acceleration sensors may advantageously be used for detecting the change in shape of the coils. A speed signal may easily be detected from the signal of an acceleration sensors and this can then be broken down by Fourier analysis in a further step into individual frequency components. The vibrational spectrum can then be converted comparatively easily into a spectrum proportional to the noise and allocated in a further step to a noise category.

It is expedient if when classifying the electric sheet steel the subsequent operating conditions of the electrical machine have already been taken into consideration, i.e. the excitation winding is fed with 50 Hz (Europe) or 60 Hz (USA) and variable amplitude.

It has been found that it may be advantageous if the magnetic flux produced by means of the excitation winding in the strip-wound coil is predefined stepwise in a technically relevant interval between 0.5 T and 2 T. In practice steps of about 0.1 T have proven to be advantageous. The noise behavior to be anticipated can consequently be determined as a function of the magnetic modulation.

Good classifying of the noise behavior of the electric sheet steel may be achieved in particular if, when evaluating the measurement signals of the detectors, only speed amplitudes of integral multiples of the predefined frequency (100 Hz, 150 Hz, 200 Hz, . . . or 120 Hz, 180 Hz, 240 Hz, . . . ) are used.

It may also be advantageous if the spectral speed fractions are standardized to a certain width of the strip-wound coil, by way of example to a width of 1 m. Classifying independently of the size of the coils supplied is possible as a result.

A particularly precise prediction may be made if the vibrations of the strip-wound coil are detected by a plurality of sensors on one or both end face(s) and these measurement signals are averaged.

It is advantageous if the measured values are converted into noise levels (sound power levels) and stored in a database, so a certain change in shape of the sheet material that occurs during operation can be allocated to certain values of the magnetic flux density in each case.

Different measuring principles may be used as sensors for detecting the deformation; by way of example piezo sensors, laser interferometers and ohmic, capacitive or inductive measuring transducers.

BRIEF DESCRIPTION OF THE DRAWINGS

To explain the invention further reference will be made in the section of the description below to the drawings, in which further advantageous embodiments, details and developments of the invention can be found, and in which.

EXECUTION OF THE INVENTION

Figure 1:
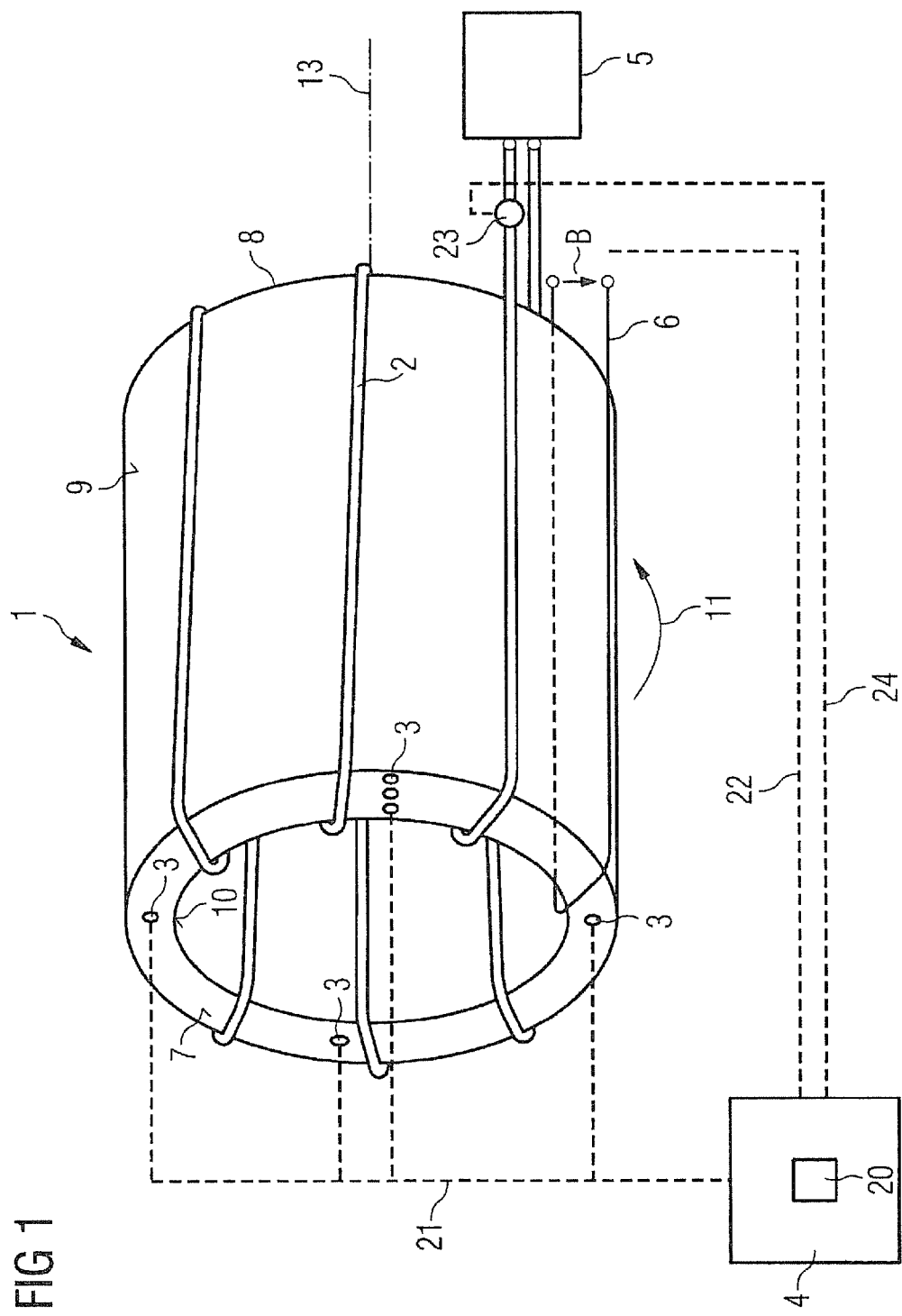
FIG. 1 shows in a schematic diagram a strip-wound coil with an excitation winding and an inventive measuring and evaluation device for classifying the strip-wound coil with regard to noise emission and losses.

FIG. 1 shows in a three-dimensional sketch a hollow-cylindrical strip-wound coil 1. When producing an electrical machine, such as a power transformer, such a strip-wound coil 1 constitutes the starting product from which the individual sheet metal parts of the magnetically soft transformer core are punched in a subsequent processing step. Such a strip-wound coil conventionally has a diameter, for instance in large machine construction, of up to 900 mm, a width of 70 cm to 1 m and a mass of about 1 to 5 tons.

As already mentioned in the introduction, practice shows that the noise behavior of electrical machines, which are produced from such a starting material, varies from strip-wound coil to strip-wound coil more or less to the same degree. However, when producing a low-noise electrical machine the aim is to use a magnetically soft material with optimum advantageous magnetostriction properties.

According to the invention a strip-wound coil or coil 1 (the material is conventionally supplied in this form in the case of production of an electrical machine) is classified or categorized as a whole. The coil 1 is provided with an excitation winding 2 for this purpose. As may be seen from FIG. 1, this excitation winding 2 extends transversely to the circumferential direction 11 in the direction of the axis 13 and winds spirally around the outer circumferential surface 9, the end faces 7 and 8, and the inner circumferential surface 10 of the hollow-cylindrical strip-wound coil 1. The excitation winding 2 is connected to a feeding device 5. The feeding device 5 provides the excitation winding 2 with a sinusoidal input terminal voltage that can be adjusted with regard to frequency and amplitude.

A sinusoidal voltage preferably with e.g. 50 Hz or 60 Hz is now applied to the excitation winding 2 for classifying the strip-wound coil with regard to noise emission. The alternating current flowing in the excitation winding 2 causes a magnetic alternating flux to form in the strip-wound coil 1 which is oriented in the circumferential direction 11.

The current fed into the excitation winding is detected by means of a current sensor 23. The measured value 24 provided by the current sensor 23 is passed to an evaluation unit 4.

To detect the magnetic flux in the sheet coil 1 caused by the excitation winding 2, a measuring loop 6 is arranged around the strip-wound coil 1. A voltage is induced in the measuring loop 6 in the event of a change in flux in the sheet coil 1, and this is proportional to the magnetic flux density B. The induced voltage is passed to the evaluation device 4 as a measured value 22.

The magnetic alternating flux that spreads in the circumferential direction 11 of the strip-wound coil 1 produces a change in the shape of the strip-wound coil 1 due to the magnetostriction of the magnetically soft material. A change in the length of the winding as well as a transverse contraction occurs, i.e. a change in the axial length of the strip-wound coil 1.

A sensor device 3 is arranged on the end face 7 to detect this deformation. The sensors 3 provide measurement signals 21, which are also supplied to the evaluation device 4.

For classifying the strip-wound coil with regard to noise emission the input terminal voltage of the excitation winding 2 is now changed stepwise until a certain flux density value is attained in the strip-wound coil 1. The measurement signals provided by the sensors 3 are evaluated in the evaluation device 4 as follows for this adjusted flux density:

The measurement signals of the sensors 3 are broken down into frequency components in the evaluation device 4 by means of a Fourier analysis. Only the speed amplitudes of the integral multiples of 50 Hz or 60 Hz are considered in this case.

The spectral speed amplitudes are standardized to a length unit of the strip-wound coil 1, by way of example to one meter sheet width of the strip-wound coil 1. A mean value is formed for each frequency component:

$$\overline{V}_j = \frac{1}{M}\sum_{i=1}^{M} v_{j,i}$$

$V_j$ ... mean speed at frequency j
$M$ ... number of sensors
j ... j'th frequency component (e.g. 100 Hz comp.)

An averaged sound power level is then calculated for each frequency component.

$$L_{W,j} = 10 \cdot C_j \cdot \log(\overline{V}_j)^2 \quad C_j \ldots \text{interface factor}$$

The interface factor $C_j$ takes account of differences in noise emission of different frequency components j. The interface factors $C_j$ are quantitatively selected such that they represent the connection between a vibrating surface of 1 m² and the sound power $L_w$.

In a further step the non-rated and A-rated sound power levels are calculated according to formula $$L_W = 10 \cdot \log\left(\sum_{j=1}^{N} 10^{0,1*L_{W,j}}\right)$$

N ... number of 50 Hz multiples
or $$L_{WA} = 10 \cdot \log\left(\sum_{j=1}^{N} 10^{0,1*(L_{W,j}-A_j)}\right)$$

$A_j$ ... A-rating at frequency $f_j$.

A storage device 20 designed as a database is implemented in the evaluation device 4, in which measured values of the flux density, the calculated relative total sound power level and spectral components are stored. The strip-wound coils can be graded using these values and the effect of a strip-wound coil on the noise behavior of an electrical machine can be better predicted therefore.

The magnetic loss value and the magnetization requirement of the strip-wound coil are simultaneously also determined for each predefined value of the magnetic flux density by means of evaluation device 4. These values are also stored in the database 20. It is consequently possible to also predict the magnetization losses and the magnetization power requirement of an electrical machine more accurately.

Figure 2:
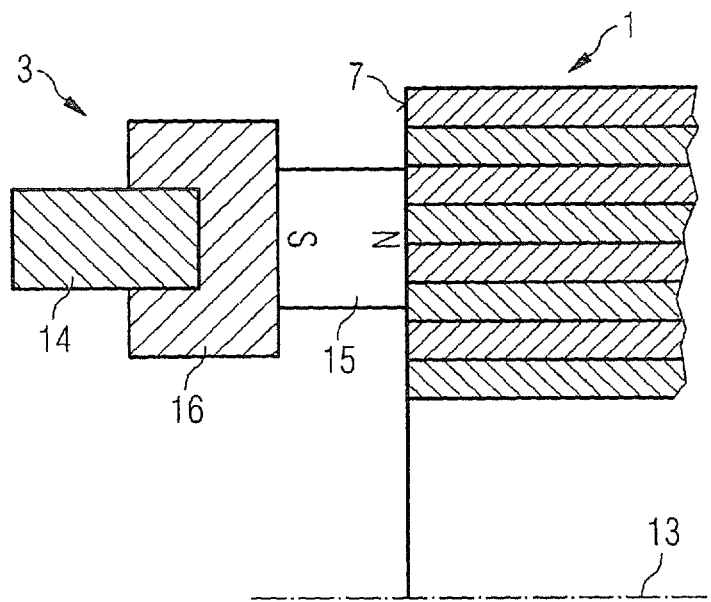
FIG. 2 shows a detailed diagram of FIG. 1, in which the arrangement of an acceleration sensor device on an end face of the strip-wound coil is shown in section.

FIG. 2 shows a possible arrangement of a sensor device 3. An exemplary embodiment is shown in which the sensor 3 is designed as an acceleration sensor 14 and is arranged by means of a connecting piece 16 and by means of a permanent magnet 15 on an end face 7 of the hollow-cylindrical strip-wound coil 1. The acceleration sensor 14 detects the axial deformation of the strip-wound coil 1, which is produced by the magnetic alternating flux in the sheet strip 1. The measuring information is supplied to the evaluation unit 4 as measurement signal 21 (see FIG. 1). The sensor 3 could also be secured in a different way, by way of example by a glued or wax joint. As already mentioned, a plurality of sensors can be secured to the end face 7 in this or a different way.

Figure 3:
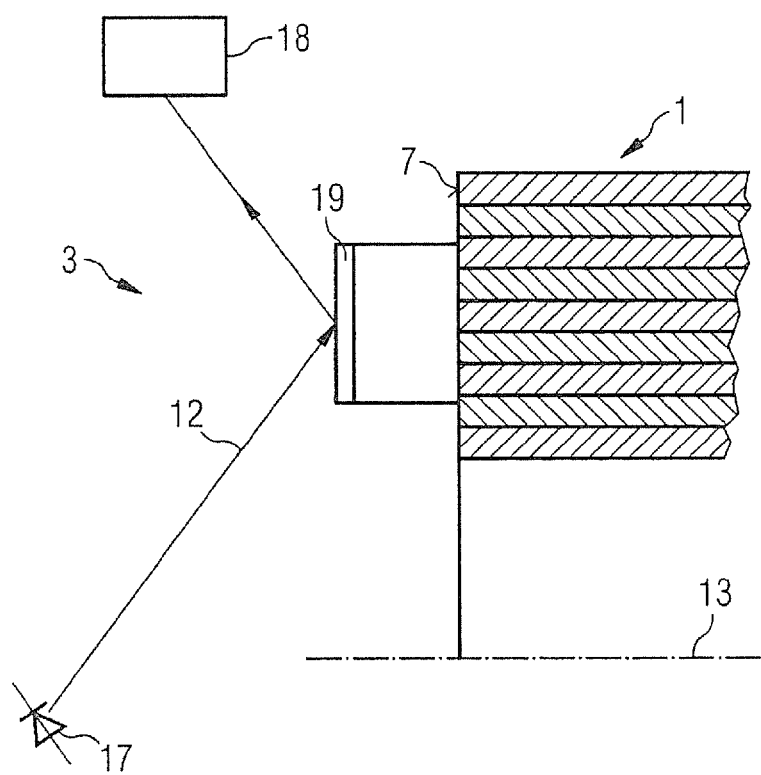
FIG. 3 shows a detailed diagram of FIG. 1, in which the arrangement of an optical sensor device on an end face of the strip-wound coil is shown in section.

FIG. 3 shows a different embodiment of the sensor device. The sensor device 3 is designed here as an optical sensor device. An optical transmitting device 17 produces a light beam 12 directed onto a reflector 19. This light beam 12 is reflected in different ways according to the magnetostriction of the magnetically soft material, and this is detected by an optical detector 18. The measuring information of the detector 18 is again passed to the evaluation unit 4.

As already mentioned, other measuring methods are also conceivable for detecting the deformation of the strip-wound coil 1, by way of example ohmic, capacitive or inductive sensors.

The inventive method allows strip-wound coils (strip-wound coils) to be complied into a category and, more precisely, simultaneously with regard to the noise emission to be anticipated, the magnetic losses and the magnetization power requirement. Different material properties at the start and end of the strip-wound coil cease to apply as a result of the overall evaluation of the strip-wound coil.

The invention claimed is:

1. A method for classifying electric sheet steel which is used for producing an electrical machine and is in the form of a strip-wound coil, comprising:
   producing a magnetic flux that changes over time and that causes a change in the shape of the strip-wound coil and magnetic losses in the strip-wound coil by means of an excitation winding fed by a feeding device;
   measuring the change in shape and/or the magnetic losses by means of a measuring device and the measurement signal obtained in the process is supplied to an evaluation device; and
   using the measurement signal by the evaluation device to categorize the electric sheet steel with regard to noise emission and/or magnetic losses.

2. The method as claimed in claim 1, wherein the measuring device comprises a sensor device which is arranged on an end face of the strip-wound coil.

3. The method as claimed in claim 2, wherein the sensor device is formed by an acceleration sensor.

4. The method as claimed in claim 3, wherein the acceleration sensor generates a measurement signal which is converted in the evaluation device into a speed signal which is then broken down into frequency components.

5. The method as claimed in claim 4, wherein a fast Fourier transformation is carried out in the evaluation device.

6. The method as claimed in claim 5, wherein the excitation winding is fed with a sinusoidal input terminal voltage of predeterminable frequency and of predeterminable amplitude.

7. The method as claimed in claim 6, wherein the predeterminable frequency is 50 Hz.

8. The method as claimed in claim 6, wherein the predeterminable frequency 60 Hz.

9. The method as claimed in claim 6, wherein the magnetic flux is predefined in a technically relevant range between 0.5 T and 2 T steps where T is the unit Tesla.

10. The method as claimed in claim 9, wherein the magnetic flux is in 0.1 T steps wherein T is the unit Tesla.

11. The method as claimed in claim 10, wherein only speed amplitudes of the integral multiples of the predefined frequency are used for the categorization of the electric sheet steel.

12. The method as claimed in claim 11, wherein the speed amplitudes are standardized to a width unit of the strip-wound coil.

13. The method as claimed in claim 12, wherein the width is 1 m.

14. The method as claimed in claim 12, wherein a mean value is formed in the evaluation device from spectral speed amplitudes according to a first formula:

$$\overline{V}_j = \frac{1}{M}\sum_{i=1}^{M} v_{j,i}$$

Wherein $v_{i,j}$ are the spectral speed amplitudes,
wherein $V_j$ . . . is the mean speed at frequency j,
wherein M . . . is the number of sensors, and
wherein j . . . is the j'th frequency component (e.g. 100 Hz comp.).

15. The method as claimed in claim 14, wherein for each frequency component of the fast Fourier analysis an averaged sound power level is formed according to a second formula:

$$L_{W,j} = 10 \cdot C_j \cdot \log(\overline{V}_j)^2$$

wherein
$C_j$ is an interface factor.

16. The method as claimed in claim 15, wherein a total sound power level and an A-rated total sound power level are calculated in the evaluation device using a third formula:

$$L_W = 10 \cdot \log\left(\sum_{j=1}^{N} 10^{0.1 * L_{W,j}}\right)$$

wherein N is the number of 50 Hz multiples, according to a fourth formula:

$$L_{WA} = 10 \cdot \log\left(\sum_{j=1}^{N} 10^{0.1 * (L_{W,j} - A_j)}\right)$$

wherein $A_j$ is an A-rating at frequency $f_j$.

17. The method as claimed in claim 16,
wherein the measuring device comprises a measuring loop which detects the magnetic flux density in the strip-wound coil as a measured value, and,
wherein the measured value is supplied to the evaluation device.

18. The method as claimed in claim 17, wherein the calculated relative total sound power level and spectral components and measured values of the magnetic flux density are stored in a storage device of the evaluation device.

19. The method as claimed in claim 18, wherein a loss value is calculated in the evaluation device for one value respectively of a magnetic flux density in the strip-wound coil and is stored in the storage device.

\* \* \* \* \*